(12) United States Patent
Barr et al.

(10) Patent No.: US 6,871,051 B1
(45) Date of Patent: Mar. 22, 2005

(54) SERIAL DATA TRANSMISSION SYSTEM USING MINIMAL INTERFACE

(76) Inventors: Keith Barr, 645 Tigertail Rd., Los Angeles, CA (US) 90049; Frank Thomson, 4019 Bledsoe Ave., Los Angeles, CA (US) 90066; Peter Celi, 16178 Sunset Blvd. #D, Pacific Palesades, CA (US) 90272

(*) Notice: Subject to any disclaimer, the term of this patent is extended or adjusted under 35 U.S.C. 154(b) by 549 days.

(21) Appl. No.: 09/603,839

(22) Filed: Jun. 26, 2000

(51) Int. Cl.$^7$ ................................................ H03L 7/06
(52) U.S. Cl. .................... 455/180.3; 370/354; 370/356; 375/362; 331/177 R
(58) Field of Search .................... 370/354, 356; 375/362; 455/180.3; 331/177 R

(56) References Cited

U.S. PATENT DOCUMENTS

| | | | | |
|---|---|---|---|---|
| 4,755,817 A | | 7/1988 | Vandenbulcke et al. | 340/825.57 |
| 5,036,216 A | * | 7/1991 | Hohmann et al. | 327/157 |
| 5,459,437 A | * | 10/1995 | Campbell | 331/111 |
| 5,477,198 A | * | 12/1995 | Anderson et al. | 331/177 R |
| 6,313,707 B1 | * | 11/2001 | Fischer et al. | 331/17 |
| 6,327,272 B1 | * | 12/2001 | Van Steenbrugge | 370/498 |
| 6,385,263 B1 | * | 5/2002 | Bowers et al. | 375/356 |
| 6,424,649 B1 | * | 7/2002 | Laor et al. | 370/359 |
| 6,529,083 B2 | * | 3/2003 | Fujita | 331/49 |
| 2002/0186063 A1 | * | 12/2002 | Lee et al. | 327/156 |

* cited by examiner

*Primary Examiner*—Nick Corsaro
*Assistant Examiner*—Alan T. Gantt

(57) ABSTRACT

A data transmission system comprising a transmitter and a receiver that use a single external word clock to generate all needed clocks locally using a clock generator and a phase locked loop. Data words are transmitted on a transmission line based on a single transition of the word clock. The transmitter and receiver may each be incorporated on a single chip.

13 Claims, 5 Drawing Sheets

SERIAL DATA TRANSMISSION SYSTEM USING MINIMAL INTERFACE

I. BACKGROUND OF THE INVENTION

The present invention relates generally to data transmission systems, and more particularly to serial data transmission systems for transmitting data words in a sequence of data bits.

Data transmission systems require a clock to coordinate transmission of data.

Traditional serial transmission systems require a data line and three clocks—a word clock, a high frequency bit clock, and a high frequency system clock. Example values for these lines are as follows: word clock at 48 Khz, bit clock at 3.072 MHz, a system clock at 12.288 MHz and a data line that sends data at the 3.072 MHz rate. An example system that uses multiple clock signals is the system described in U.S. Pat. No. 4,755,817 to Vandenbulke et al. that uses two high-frequency clock signals to transmit data words.

The use of a plurality of clocks increases the size of an interface between a transmitter and receiver. The use of high frequency clocks in an interface generates undesirable radio frequency (RF) emissions. Circuit designers have created expensive system serial transmission systems in order to attempt to compensate for the large interface requirements and to comply with emission standards.

Conventional systems typically output a word during a signal high time and another word during a signal low time. Therefore, these systems require a word clock with a specified duty cycle to ensure time on each level for the output of a word. The typical duty cycle is fifty percent. A duty cycle is the ratio of signal high time to signal low time. If such a clock is not readily available to the designer, the system may require additional circuitry.

Conventional transmitters and receivers are not integrated onto a single chip due to the size of the phase locked loop (PLL) typically included in the devices. A loop filter in the conventional PLL is composed of a resistor and capacitor where the size of the combination of these elements is too large for a single chip. Using more than one chip for the transmitter or receiver increases the cost and size of the system. Therefore, it is desirable to have a receiver and transmitter that are each integrated onto a single chip.

II. SUMMARY OF THE INVENTION

The present invention provides for a simple interface of a data line and one clock line between a transmitter and receiver.

Systems and methods consistent with the present invention include structure for transmitting data words using locally generated clock signals.

A data system consistent with the present invention receives a periodic word clock (WC) signal and includes a phase locked loop (PLL) for receiving the WC signal and generating a first clock having a frequency that is a multiple of the WC signal, and a clock generator for receiving the first clock and generating a plurality of second clock signals that have frequencies that are submultiples of the first clock signal.

Another data system consistent with the present invention receives a periodic word clock (WC) signal and includes a transmitter and receiver. The transmitter includes a first input for receiving the WC signal, structure for generating a plurality of clock signals based on the WC signal, and a first output connected to a transmission line for the transmission of data. The receiver includes a first input for receiving the WC signal, a second input, connected to the transmission line, for receiving data transmitted by the transmitter, and structure for generating a plurality of clock signals based on the WC signal.

A method consistent with the present invention receives a word clock (WC) signal, generates a first clock having a frequency that is a multiple of the WC signal, and receives the first clock and generates a plurality of second clock signals that have frequencies that are submultiples of the first clock signal.

A phase locked loop incorporated on a single chip consistent with the present invention includes a phase comparator, a charge pump receiving output from the phase comparator, and a voltage controlled current source receiving output from the charge pump.

Both the foregoing general description and the following detailed description are exemplary and do not restrict the invention as claimed.

III. BRIEF DESCRIPTION OF THE DRAWINGS

The accompanying drawings, which are incorporated in and constitute a part of this specification, illustrate one embodiment consistent with the invention and, together with the description, serve to explain the objects, advantages, and principles of the invention. In the drawings:

FIG. 1 is a block diagram of a data system consistent with this invention;

FIGS. 2(a) and 2(b) depict signals in the system of FIG. 1;

IV. DETAILED DESCRIPTION OF THE PREFERRED EMBODIMENTS

Reference will now be made in detail to embodiments consistent with this invention that are illustrated in the accompanying drawings. The same reference numbers in different drawings generally refer to the same or like parts.

The present invention provides for a transmitter and receiver that receive a single word clock. Additional clocks are then generated locally to be used in a control circuit to generate control signals. The control signals control the reception and transmission of data. System interface is simplified because only a single external clock is required. Excessive emissions are reduced when the external clock is not a high frequency clock. Any high frequency clocks needed are generated locally.

The present invention further provides for a transmitter that may be integrated onto a single chip and a receiver that may be integrated onto a single chip. A loop filter in a phase locked loop in the transmitter and receiver has a charge pump and capacitor that are small enough to be included on a single chip along with all the other elements of the devices.

Figure 1:
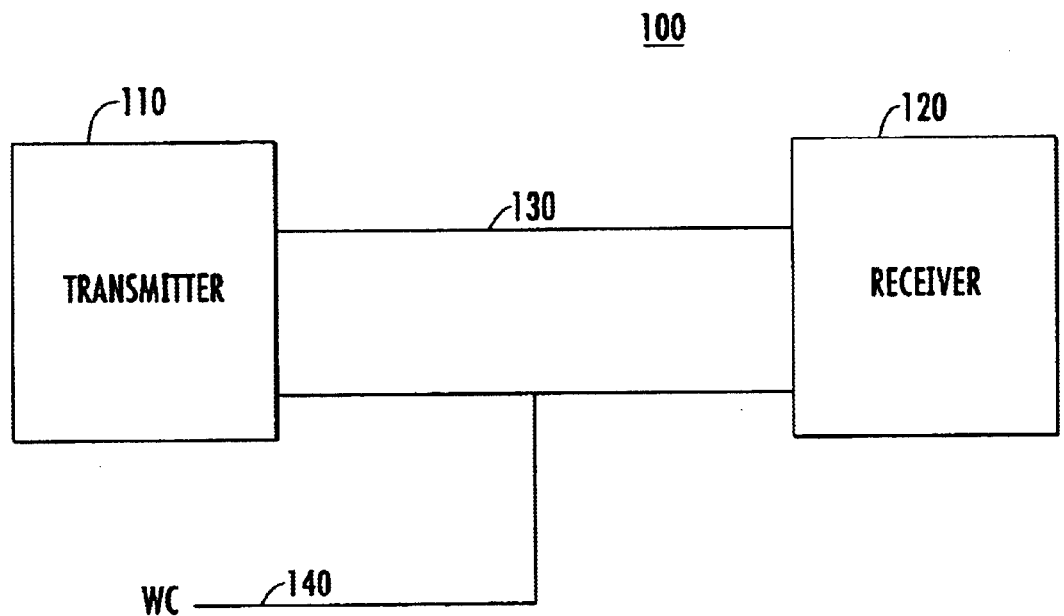

FIG. 1 is a block diagram of a system 100 consistent with this invention. A transmitter 110 sends data to receiver 120 over the data transmission line 130. The receiver may be, for example, a digital to analog converter or digital signal processor. The transmitter may be, for example, an analog to digital converter or digital signal processor. Both transmitter 110 and receiver 120 receive a word clock (WC) 140 that could be generated by the transmitter 110, receiver 120, or from an external source.

Figure 2:
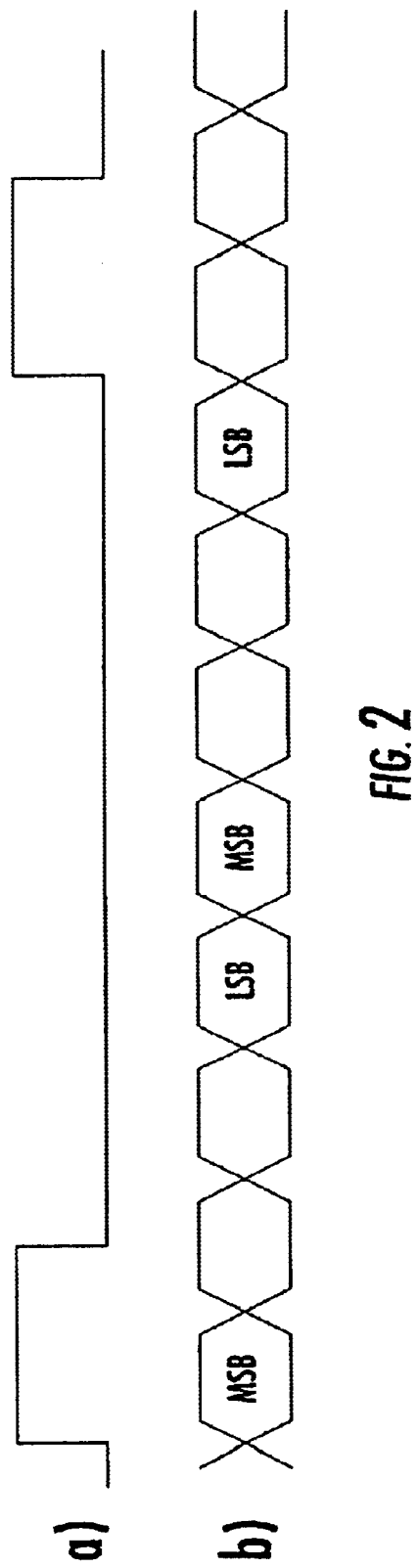

FIG. 2(a) is a signal diagram of WC 140, and FIG. 2(b) is a diagram showing the relationship of the data on the transmission line 130 with respect to WC 140. In this example, data transmission is coincident with the rising edge (low to high transition) of WC 140. Data in FIG. 2(b) is shown as being transmitted with the most significant bit (MSB) first but could as well be transmitted with the least significant bit (LSB), or in any appropriate format.

Only one transition of WC 140 is required to initiate transmission of all data bits of all data words. The duty cycle of WC 140 may vary. The present invention transmits all data words from a storage element in response to a single transition of WC 140 and does not require sending one data word per level transition of the clock. As shown in FIG. 2(a) transmission of the second word in a storage element does not require a separate clock transition to initiate output. Instead the single transition from high to low of WC 140, along with an output control signal, initiates transmission of all data in a storage element and the additional transitions of WC 140 do not affect the ongoing transmission of the data words.

Figure 3:
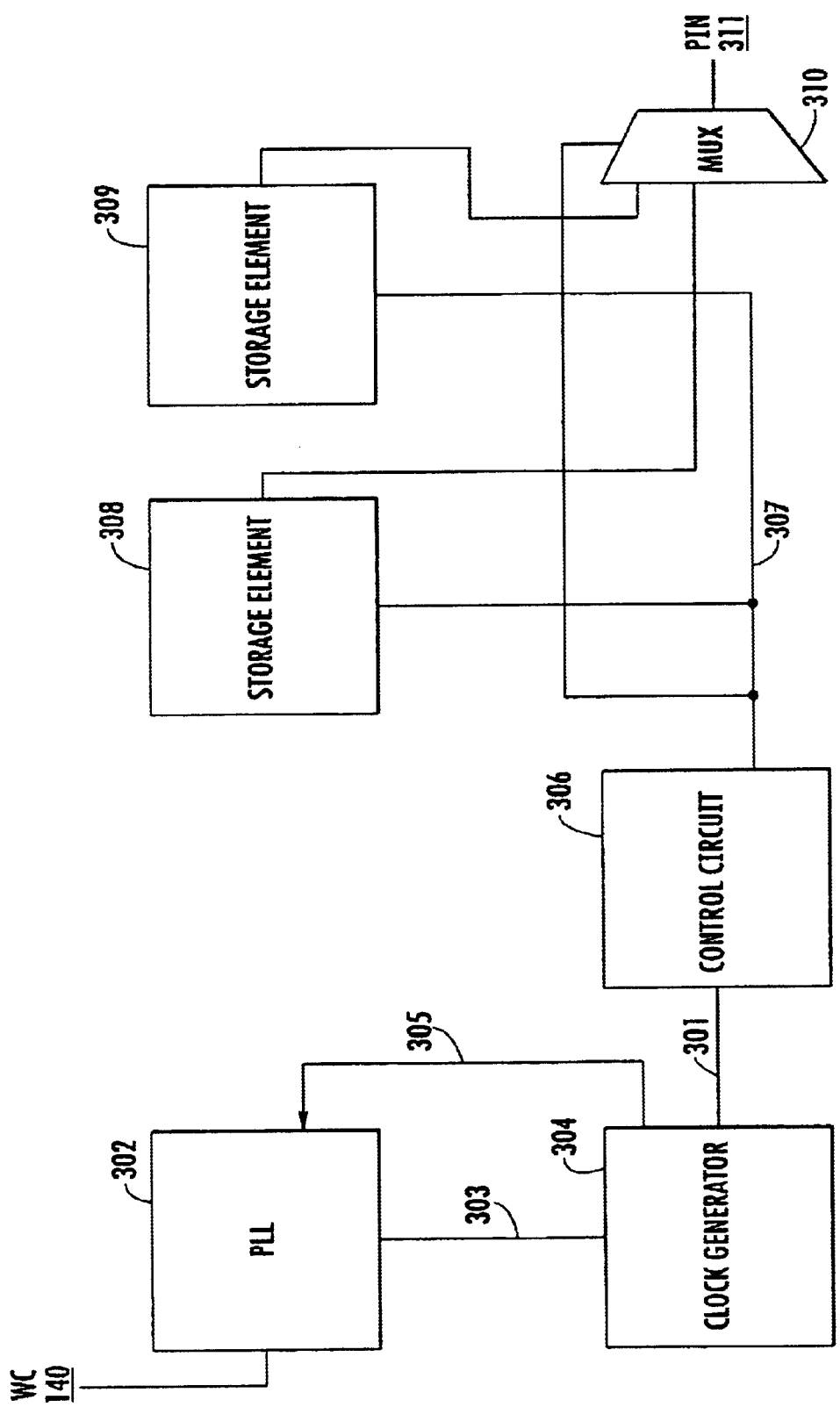
FIG. 3 is a diagram of a transmitter consistent with the present invention.

FIG. 3 is a block diagram of transmitter 110. WC 140 is presented to a phase-locked loop (PLL) 302 which generates a system clock signal 303 that is a multiple of WC 140's frequency such as 256 times WC 140. System clock signal 303 enters clock generator 304, which produces multiple clock signals 301 with frequencies that are submultiples of the system clock signal 303. For example, if WC is 48 kHz then the clock signals 301 are 6.144 MHz, 3.072 Mhz, . . . down to 48 kHZ. The higher frequency clock signals 301 are bit clock signals. One of clock signals 301, signal 305, has the same frequency as WC 140, and is presented back to PLL 302 to use as a reference to adjust the phase and frequency of clock signal 303. PLL 302 slows down or speeds up signal 303 so that signal 305 matches WC 140 in both phase and frequency.

Clock signals 301 are presented to control circuit 306. Control circuit 306 uses clock signals 301 when producing control signals 307 to operate storage elements 308 and 309, as well as multiplexer 310. The designer of control circuit 306 selects which of the clock signals to use when designing the circuit. This provides the designer with many options in how to design the circuit.

Control signals 307 are sent to the storage element 308, storage element 309, and multiplexor 310. Storage elements 308 and 309 are capable of serially shifting out data through multiplexer 310 under the control of control signals 307. The output of multiplexer 310 drives serial output pin 311. Multiplexor 310 outputs data based on the control signals and WC 140. As discussed with respect to FIG. 2(a), data words in a storage element are preferably output in response to a single transition of WC 140. However, a circuit designer may select other clock signals to initiate transmission.

Control signals 307 cause the start of transmission of data stored in the storage elements to be substantially coincident with a rising edge on the WC 140 signal. Clock generator 304 generates sufficient clocks to transmit the data contained in the storage elements 308 and 309 prior to another rising edge on the WC 140 signal. A circuit designer may alternatively select the falling edge of a clock signal to initiate word transmission.

Figure 4:
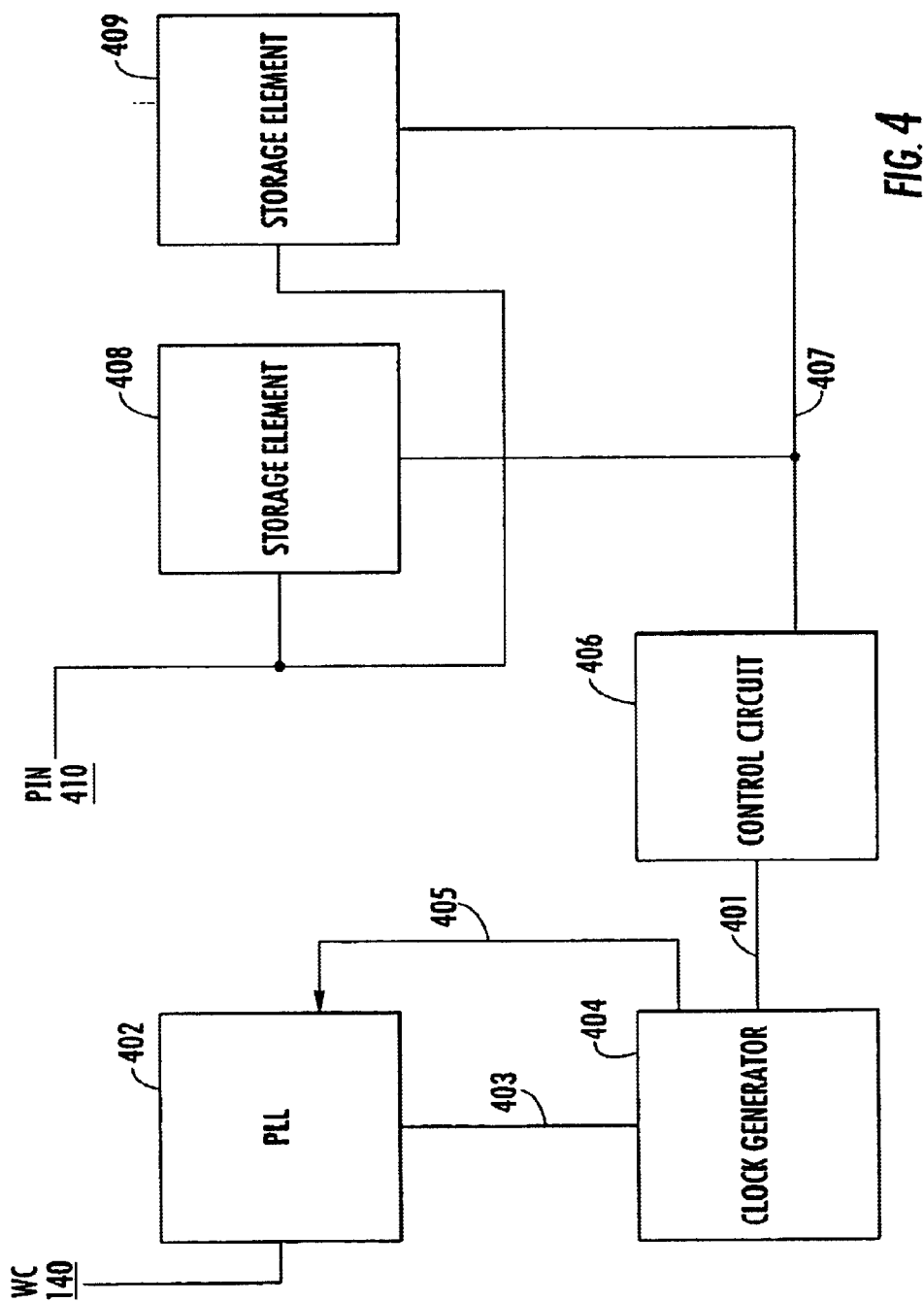
FIG. 4 is a diagram of a receiver consistent with the present invention.

FIG. 4 is a detailed circuit diagram of receiver 120. WC 140 is presented to a phase-locked loop (PLL) 402 which generates a system clock signal 403 that is a multiple of WC 140's frequency such as 256 times WC 140. System clock signal 403 enters clock generator 404, which produces multiple clock signals 401 with frequencies that are submultiples of the clock signal 403. For example, if WC is 48 kHz then the clock signals 401 are 6.144 MHz, 3.072 Mhz, . . . down to 48 kHZ. The higher frequency clock signals 401 are bit clock signals. One of clock signals 401, signal 405, has the same frequency as WC 140, and is presented back to PLL 402 to use as a reference to adjust the phase and frequency of clock signal 403. PLL 402 slows down or speeds up signal 403 so that signal 405 matches WC 140 in both phase and frequency.

Clock signals 401 are presented to control circuit 406. Control circuit 406 uses clock signals 401 when producing control signals 407 to operate storage elements 408 and 409. The designer of control circuit 406 selects which of the clock signals to use when designing the circuit. This provides the designer with many options in how to design the circuit.

Clock signals 401 are presented to control circuit 406, which produces control signals 407 to operate storage elements 408 and 409. Storage elements 408 and 409 are capable of serially shifting in their data from the serial input pin 410 under control of control signals 407.

Control signals 407 cause the start of reception of data to be substantially coincident with a rising edge on the WC 140 signal. The clock generator 404 generates sufficient clocks to receive the data into the selected storage elements 408 and 409 prior to another rising edge on the WC 140 signal. A circuit designer may alternatively select the falling edge of a clock signal to initiate word transmission.

In another embodiment of the present invention, the entire transmitter shown in FIG. 3 is included on an integrated chip. Similarly, the entire receiver shown in FIG. 4 is on an integrated chip. Conventional receivers and transmitters are not included on a single chip because the filter in the resister-capacitor combination used in the PLL is too large for a single chip. The present invention uses a charge pump instead of the resistor-capacitor combination used in a conventional PLL. The charge pump is small enough to fit on a single chip along with other elements.

Figure 5:
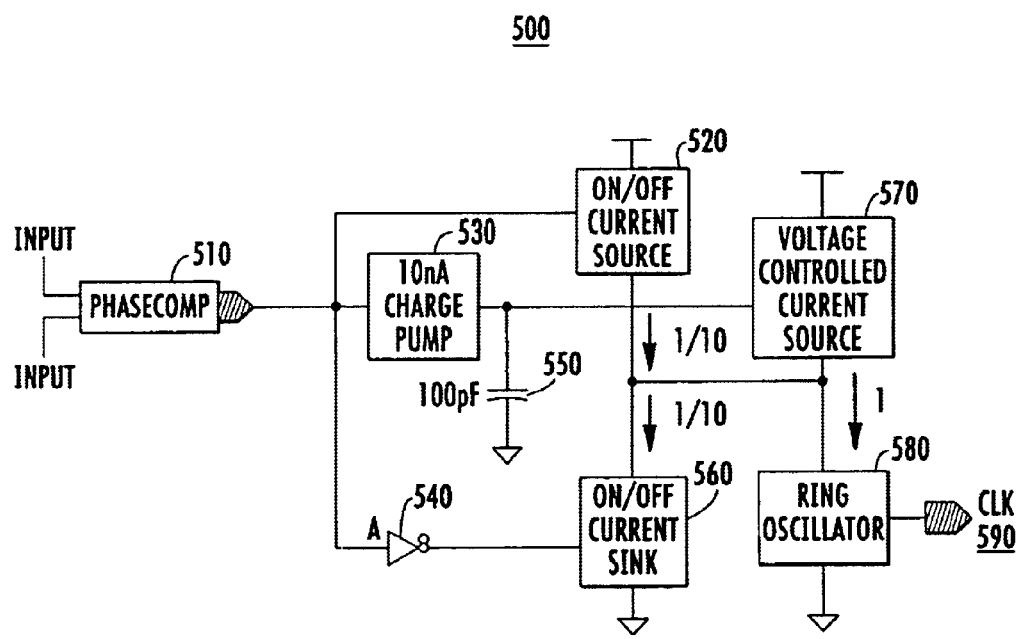
FIG. 5 is a diagram of a phase locked loop that may be used in the transmitter and receiver consistent with the present invention.

FIG. 5 shows PLL 500 on a single chip in accordance with the present invention.
PLL's adjust the frequency and the phase of two received signals so that, based on feedback, the two signals will adjust to match in frequency and rise and fall at the same time.

PLL 500 includes a phase comparator 510 that compares two signals such as WC 140 and the output 305 of clock generator 304 in FIG. 3 or WC 140 and the output 405 of clock generator 404 in FIG. 4. The phase comparator 510 produces a pulse when the received signals do not rise or fall at the same time. Phase comparators work in several different ways. For example, the phase comparator may generate a pulse that starts when one signal rises and stops when the other signal rises.

Phase comparator 510 directs a pulse to charge pump 530 to apply/remove an amount of charge to the capacitor. The pulse from phase comparator 510 is also applied to current source 520 and is inverted through inverter 540 to apply an inverted form to current sink 560.

A charge pump is a circuit that delivers a determined amount of charge to a device. Charge pump 530 may provide a current of, for example, 10 nA. Charge pump 530 puts a charge on capacitor 550. This charge is used as a voltage to control the voltage controlled current source 570 that in turn applies a current to the ring oscillator 580 to cause it to oscillate at a particular frequency relative to the charge on capacitor 550. This current from voltage controlled current source 570 controls the frequency of ring oscillator 580 and therefore it controls the frequency of the clock output 590 from ring oscillator 580. The current source 520 and current sink 560 provide current to ring oscillator 580 to bump the oscillator's signal forward or back to adjust the phase of the clock output 590. Capacitor 550 may have a value of 100 pF, for example. Clock signal 590 may be input to the clock generator 304 and clock generator 404 in FIGS. 3 and 4 respectively. All of the elements in PLL 500 are incorporated onto a single chip.

By using a charge pump, PLL 500 is small enough to be incorporated on a single chip along with all of the other elements in the transmitter of FIG. 3 without requiring any external support circuitry. Similarly, PLL 500 may be incorporated on a single chip along with all of the elements in the receiver of FIG. 4 without requiring any external support circuitry.

Embodiments consistent with the present invention provide for inputting a single word clock into a transmitter or receiver. The transmitter and receiver include a clock generator that generates any local clocks needed for the transmission and reception of data. This configuration allows greater flexibility for system designers as only one clock needs to be externally generated and multiple clocks may be generated and used locally.

Embodiments consistent with the present invention provide for a transmitter on a single chip and receiver on a single chip. The transmitter and receiver include a PLL having a loop filter with a charge pump and capacitor small enough to be included on a single chip along with the other elements of the devices.

The foregoing description is presented for purposes of illustration and description. It is not exhaustive and does not limit the invention to the precise form disclosed. Modifications and variations are possible in light of the above teachings or may be acquired from practicing the invention. The scope of the invention is defined by the claims and their equivalents.

What is claimed is:

1. A data system receiving a periodic word clock (WC) signal, comprising:
    a transmitter including
        a first input for receiving said WC signal;
        first means for generating a plurality of transmitter clock signals based on the WC signal; said first means being a single phase locked loop (PLL) for receiving said WC signal and generating a first clock having a frequency that is a multiple of said WC signal and a clock generator for receiving the first clock and generating a plurality of second clock signals that have frequencies that are submultiples of the first clock signal; and
        a first output connected to a transmission line for the transmission of data;
    a receiver including
        a first input for receiving said WC signal;
        a second input, connected to said transmission line, for receiving data transmitted by said transmitter; and
        second means for generating a plurality of receiver clock signals based on the WC signal; said second means for generating being a single phase locked loop (PLL) for receiving said WC signal and generating a first clock having a frequency that is a multiple of said WC signal and a clock generator for receiving the first clock and generating a plurality of second clock signals that have frequencies that are submultipls of the first clock signal.

2. The data system of claim 1 wherein said clock generator outputs one of the second clock signals having a same frequency as the WC signal to the PLL, and said PLL adjusts the first clock signal based on the received one of the second clock signals.

3. The data system of claim 1 further including:
    a control circuit responsive to the second clock signals for generating control signals.

4. The data system of claim 3 further including:
    a storage element responsive to the control signals for outputting all data words in the storage element.

5. The data system of claim 4 further including:
    a multiplexor for passing the output data to a data pin in response to the control signals.

6. The data system of claim 5 wherein said multiplexor outputs the output data based on a single transition of said WC signal.

7. The data system of claim 1 wherein said clock generator outputs one of the second clock signals having a same frequency as the WC signal to the PLL, and said PLL adjusts the first clock signal based on the received one of the second clock signals.

8. The data system of claim 1 further including:
    a control circuit responsive to the second clock signal for generating control signals.

9. The data system of claim 1 wherein said transmitter is incorporated on a single chip.

10. The data system of claim 9 wherein the transmitter includes a single phase locked loop (PLL), said PLL having a charge pump.

11. The data system of claim 1 wherein said receiver is incorporated on a single chip.

12. The data system of claim 11 wherein the receiver includes a single phase locked loop (PLL), said PLL having a charge pump.

13. A phase locked loop incorporated on a single chip, said phase locked loop including:
    a phase comparator;
    a charge pump coupled to an output of the phase comparator; and
    a voltage controlled current source coupled to an output of the charge pump;
    a capacitor coupled between an output of the charge pump and ground;
    an inverter having an input coupled to the phase comparator,
    an on/off current sink coupled to an output of the inverter;
    an on/off current source coupled to the phase comparator and to the on/off current sink; and
    a ring oscillator coupled to the output of the on/off current source and the voltage controlled current source.

* * * * *